United States Patent
Agarwal et al.

(10) Patent No.: US 11,913,113 B2
(45) Date of Patent: Feb. 27, 2024

(54) METHOD AND APPARATUS FOR MODULATING FILM UNIFORMITY

(71) Applicant: Lam Research Corporation, Fremont, CA (US)

(72) Inventors: Pulkit Agarwal, Beaverton, OR (US); Adrien Lavoie, Newberg, OR (US); Purushottam Kumar, Hillsboro, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 407 days.

(21) Appl. No.: 16/108,592

(22) Filed: Aug. 22, 2018

(65) Prior Publication Data

US 2020/0063259 A1 Feb. 27, 2020

(51) Int. Cl.
*C23C 16/455* (2006.01)
*H01L 21/02* (2006.01)
*C23C 16/44* (2006.01)

(52) U.S. Cl.
CPC .... *C23C 16/45536* (2013.01); *C23C 16/4408* (2013.01); *C23C 16/45519* (2013.01); *C23C 16/45565* (2013.01); *C23C 16/45574* (2013.01); *H01L 21/0228* (2013.01)

(58) Field of Classification Search
CPC ........ C23C 16/45536; C23C 16/45574; C23C 16/45519; C23C 16/45565; C23C 16/4408; H01L 21/0228
USPC .......... 427/248.1–255.7, 162–169, 569–579
See application file for complete search history.

(56) References Cited

U.S. PATENT DOCUMENTS

| | | | |
|---|---|---|---|
| 9,508,547 B1* | 11/2016 | Pasquale | C23C 16/401 |
| 9,738,977 B1* | 8/2017 | Karim | H01J 37/32513 |
| 2005/0127435 A1* | 6/2005 | Chen | H01L 29/42324 |
| | | | 257/327 |

(Continued)

FOREIGN PATENT DOCUMENTS

EP 0462730 A1 12/1991
JP 2013-070016 4/2013

(Continued)

OTHER PUBLICATIONS

International Search Report and Written Opinion from International Application No. PCT/US2019/046867 dated Dec. 3, 2019.

*Primary Examiner* — Michael G Miller
(74) *Attorney, Agent, or Firm* — Alleman Hall & Tuttle LLP

(57) ABSTRACT

A method for processing a substrate is provided, wherein the substrate is located below a showerhead in a processing chamber. A deposition layer is deposited on the substrate, wherein at least one deposition gas is provided through the showerhead. A secondary purge gas is flowed during the depositing the deposition layer from a location outside of the showerhead in the processing chamber forming a flow curtain around an outer edge of the showerhead, wherein the secondary purge gas comprises at least one component gas. A partial pressure of the at least one component gas is changed over time during the depositing the deposition layer, wherein the depositing the deposition layer has a non-uniformity, wherein the changing the partial pressure changes the non-uniformity over time during the depositing the deposition layer.

20 Claims, 5 Drawing Sheets

(56) References Cited

U.S. PATENT DOCUMENTS

| | | | |
|---|---|---|---|
| 2015/0170931 | A1 | 6/2015 | Suemasa |
| 2016/0203995 | A1* | 7/2016 | Kanarik ............ C23C 16/45527 438/703 |
| 2017/0101711 | A1 | 4/2017 | McCgraw et al. |
| 2017/0191160 | A1 | 7/2017 | Wiltse |
| 2017/0362713 | A1 | 12/2017 | Karim et al. |

FOREIGN PATENT DOCUMENTS

| | | |
|---|---|---|
| KR | 1020160087348 A | 7/2016 |
| KR | 1020170021210 A | 2/2017 |
| KR | 1020170080501 A | 7/2017 |
| KR | 1020170142891 A | 12/2017 |

\* cited by examiner

METHOD AND APPARATUS FOR MODULATING FILM UNIFORMITY

BACKGROUND

The present disclosure relates to the formation of semiconductor devices. More specifically, the disclosure relates to the formation of semiconductor devices in a system where a multiple stations are within a processing chamber.

SUMMARY

To achieve the foregoing and in accordance with the purpose of the present disclosure, a method for processing a substrate is provided, wherein the substrate is located below a showerhead in a processing chamber. A deposition layer is deposited on the substrate, wherein at least one deposition gas is provided through the showerhead. A secondary purge gas is flowed during the depositing the deposition layer from a location outside of the showerhead in the processing chamber forming a flow curtain around an outer edge of the showerhead, wherein the secondary purge gas comprises at least one component gas. A partial pressure of the at least one component gas is changed over time during the depositing the deposition layer, wherein the depositing the deposition layer has a non-uniformity, wherein the changing the partial pressure changes the non-uniformity over time during the depositing the deposition layer.

In another manifestation, a method for processing a substrate, wherein the substrate is located below a showerhead in a processing chamber is provided. A deposition layer is deposited on the substrate, using a deposition process, wherein the deposition process flows at least one deposition gas through the showerhead. A secondary purge gas is flowed during the deposition process from a location outside of the showerhead in the processing chamber forming a flow curtain around an outer edge of the showerhead, wherein the secondary purge gas is tuned to cause the deposition process to either have a dome shape or bowl shape non-uniformity.

In another manifestation, an apparatus for depositing a layer on a substrate is provided. A process chamber is provided. At least two substrate supports are within the process chamber. At least two showerheads are positioned in the process chamber, wherein each showerhead of the at least two showerhead is disposed above a substrate support of the at least two substrate supports. At least two purge gas outlets are provided, wherein each purge gas outlet of the at least two purge gas outlets is above a showerhead of the at least two showerheads and adapted to flow a secondary purge gas, so that each of the at least two showerheads has a curtain of the secondary purge gas around an outer edge of each of the at least two showerheads. At least two actuators are provided, wherein each actuator of the at least two actuators is adapted to tilt a showerhead of the at least two showerheads. A controller is controllably connected to the at least two actuators.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
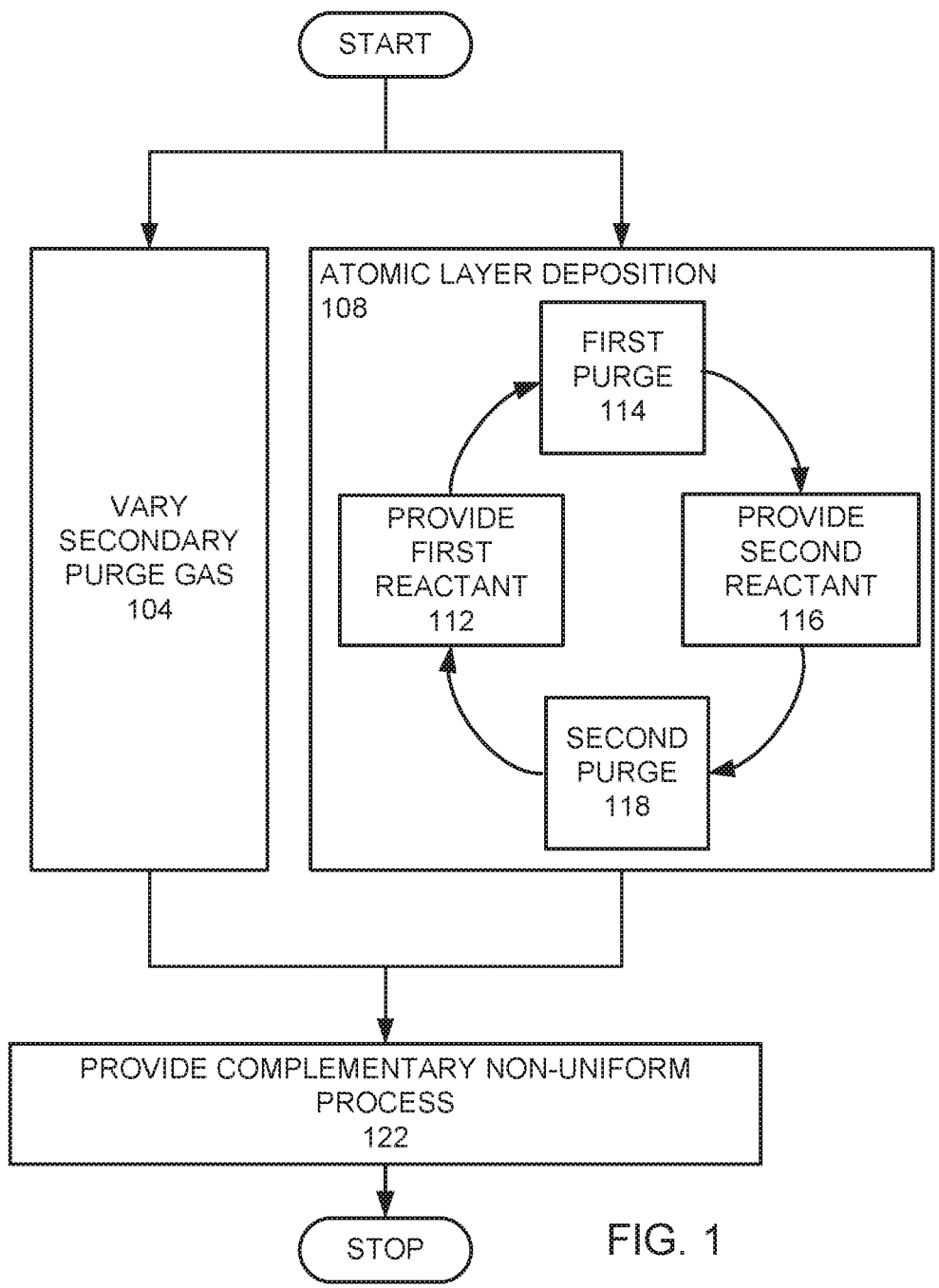
FIG. 1 is a flow chart of an embodiment.

FIG. 1 is a flow chart of an embodiment. A secondary purge gas is varied (step 104). The secondary purge gas comprises at least one component gas. The varying of the secondary purge gas changes the partial pressure of the at least one component gas over time. Simultaneously, an atomic layer deposition (ALD) process is provided (step 108). The atomic layer deposition process (step 108) comprises a plurality of cycles, where each cycle comprises providing a first reactant (step 112), purging the first reactant (step 114), providing a second reactant (step 116), and purging the second reactant (step 118).

Figure 2A:
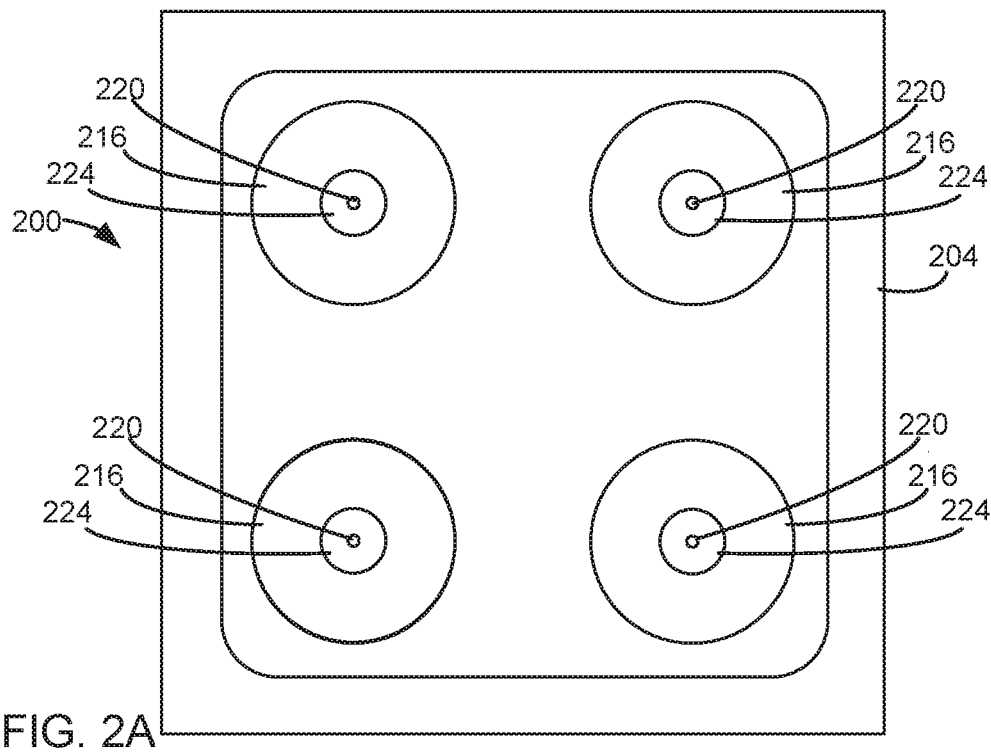
FIG. 2A is a schematic top cut away view of a process chamber that may be used in an embodiment.
Figure 2B:
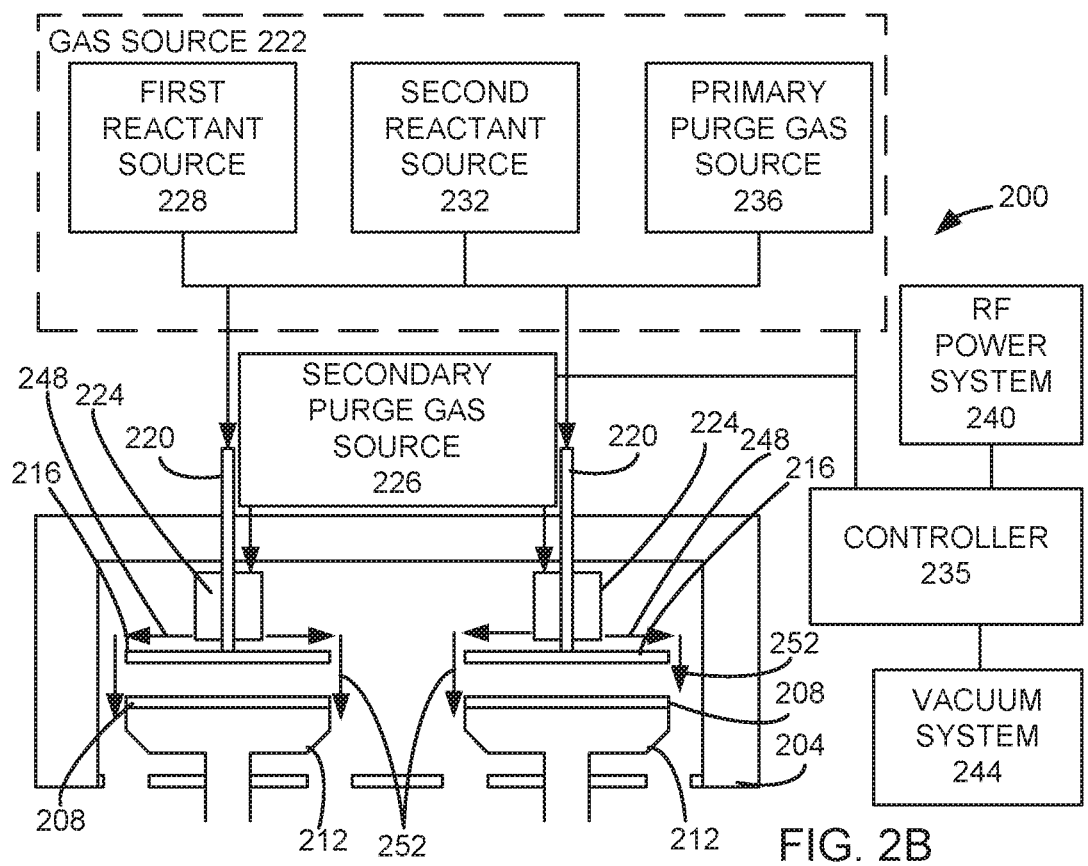
FIG. 2B is a cut away side view of the embodiment shown in FIG. 2A

FIG. 2A is a cut away top schematic view of a processing chamber 200 with four processing stations that is used in an embodiment. FIG. 2B is a cut away side view of the processing chamber 200, shown in FIG. 2A. The processing chamber 200 has a chamber wall 204. Within the chamber wall 204 are located four processing stations. Each processing station comprises a pedestal 212 for supporting a substrate 208, a showerhead 216 for providing gas to the substrate 208 below the showerhead 216, and a manifold 220 connecting the showerhead 216 to a gas source 222. In this embodiment, the gas source 222 comprises a first reactant source 228, a second reactant source 232, and a primary purge gas source 236. A secondary purge gas outlet 224 is in fluid connection with a secondary purge gas source 226. In this embodiment, the secondary purge gas outlet 224 is in the shape of a cylindrical collar surrounding the manifold 220. The cylindrical collar has apertures to allow the secondary purge gas to flow outwardly in a radial direction over the top of the showerhead 216. A controller 235 is controllably connected to the gas source 222, the secondary purge gas source 226, a radio frequency (RF) power system 240, and a vacuum system 244. An example of such a chamber is the Striker™ Oxide system manufactured by Lam Research Corporation of Fremont, Calif.

Figure 3:
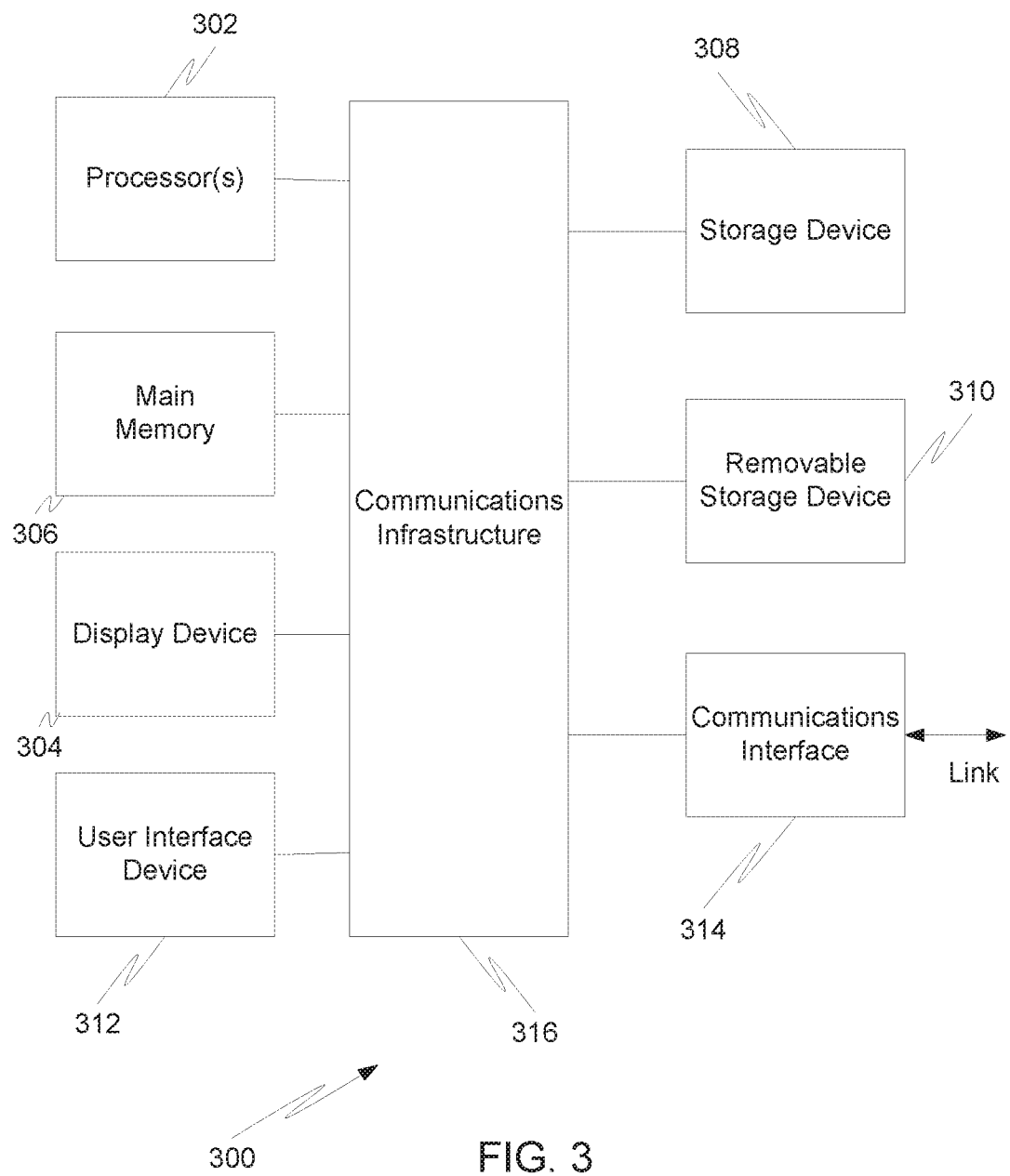
FIG. 3 is a schematic view of a computer system that may be used in practicing an embodiment.

FIG. 3 is a high level block diagram showing a computer system 300, which is suitable for implementing a controller 235 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communications interface 314 (e.g., wireless network interface). The communications interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an example of an embodiment, substrates 208 are placed on the pedestals 212. A varying flow of a secondary purge gas is provided (step 104). In this example, the secondary purge gas is oxygen ($O_2$). Oxygen is the at least one component gas of the secondary purge gas. In this example, the flow rate of the secondary purge gas is varied (step 104) by increasing the flow rate of $O_2$. As a result the partial pressure of $O_2$ is increased over time.

Simultaneously with varying the flow of the secondary purge gas (step 104), an atomic layer deposition process (step 108) is provided, which deposits an ALD layer. The atomic layer deposition process (step 108) comprises a plurality of cycles, where each cycle comprises providing a first reactant (step 112), purging the first reactant (step 114), providing a second reactant (step 116), and purging the second reactant (step 118). An example of a recipe for the atomic layer deposition process (step 108) provides a first reactant, which is 400 sccm aminosilane (step 112). A silicon containing precursor layer is deposited. After 0.4 second, the flow of the first reactant through the showerheads 216 is stopped. A first purge gas is flowed to the stations through the showerheads 216 (step 114). In this example, the first purge gas is argon and oxygen ($O_2$). The flow of the first purge gas is stopped. A second reactant is flowed into the process chamber through the showerheads 216 (step 116). In this example, an oxidation gas of 13,000 sccm Ar and 1500 sccm $O_2$ is flowed as the second reactant. The oxidation gas is transformed into a plasma. In this example, 100 to 500 watts of RF are provided at a frequency of 13.56 (megahertz) MHz. The plasma from the oxidation gas transforms the deposited silicon containing precursor layer into silicon oxide, which is part of the ALD layer. After 0.25 seconds, the flow of the second reactant into the process chamber is stopped. A purge gas is flowed into the process chamber to purge the second reactant gas (step 118). The flow of the second purge gas is stopped. The cycle then repeats from the step of flowing the precursor gas into the process chamber.

The secondary purge gas 248 flows from the secondary purge gas outlets 224 over the top of the showerheads 216 to form a secondary purge gas curtain 252 around the outer edges of the showerheads 216.

Without being bound by theory, it is believed that the time variance of the second purge gas affects the deposition at the outer edge of the substrates 208, to provide a tuned radial non-uniformity. Radial non-uniformities cause either an increase or decrease in deposition along a radial distance from a center. In an example, the thickness of deposition increases along a radial distance, without decreasing. In another example, the thickness of the deposition decrease along a radial distance without increasing. Such radial non-uniformities result in bowl shape or dome shape profiles. In this example, the time variance of the second purge gas creates a tuned variance with a bowl shape profile. In addition, the time variation improves pattern loading. When the secondary purge gas is oxygen, the oxygen is difficult to ignite. Increasing the flow of the secondary purge gas over time, makes the outer process regions more difficult to ignite over time. In addition, increasing the flow of the secondary purge gas over time increases the influence of the purge gas on the outer regions of the wafer over time.

A complementary non-uniform process is provided (step 122). The ALD process (step 108) and the complementary non-uniform process (step 122) are considered complementary if the resulting product is more radially uniform than a product that is formed by the complementary non-uniform process (step 122) alone and a product formed by the ALD process (step 108) alone. Examples of the complementary non-uniform process (step 122) may be an etch back process, a double patterning process, or a gap, trench, hole, or slot fill process for applications such as shallow trench isolation (STI) or for the manufacturing of memory devices such as dynamic random access memory (DRAM), a "not and" (NAND) gate, static random access memory (SRAM), and phase change random access memory (PCRAM).

In other embodiments, the partial pressure of the at least one component gas may be changed by keeping the flow rate of the secondary purge gas constant and varying a ratio of the at least one component gas and another gas in the secondary purge gas. In various embodiments, the at least one component gas is one of argon (Ar), helium (He), nitrogen ($N_2$), and $O_2$. In exemplary embodiments, the secondary purge gas may be pure $O_2$, $N_2$, Ar, carbon monoxide (CO), carbon dioxide ($CO_2$), ozone ($O_3$), or He. In other exemplary embodiments, the secondary purge gas may be a mixture of $O_2$ and $N_2$ with a flow ratio by number of molecules in a range from 3:1 to 1:3. In other exemplary embodiments, the secondary purge gas may be a mixture of $O_2$ and Ar or He with a flow ratio by number of molecules in a range from 3:1 to 1:3. Other gases that are inert to the ALD process and not ignited by the plasma during the ALD process may be used in other embodiments. Since the secondary purge gas is not ignited by the ALD process and is inert, the secondary purge gas provides isolation between adjacent stations to prevent cross talk.

In other embodiments, instead of providing a complementary non-uniform process (step 122) after the ALD process (step 108) and varying the secondary purge gas (step 104), the complementary non-uniform process (step 122) may be before the ALD process (step 108) and varying the secondary purge gas (step 104). In such an embodiment, the complementary non-uniform process (step 122) would form a stack that has a radial non-uniformity that is complementary to the radial non-uniformity of the ALD process (step 108) performed simultaneously with the varying the secondary purge gas (step 104).

In some embodiments, the varying the secondary purge gas (step 104) varies the secondary purge gas during the entire time of providing the ALD process (step 108). In some embodiments, the varying the secondary purge gas (step 104) does not vary the secondary purge gas during the entire time of providing the ALD process (step 108), but at least part of the duration of the providing the ALD process (step 108). In an exemplary embodiment, the varying the secondary purge gas (step 104) is changing the secondary purge gas over at least half the duration of the providing the ALD process (step 108).

Figure 4:
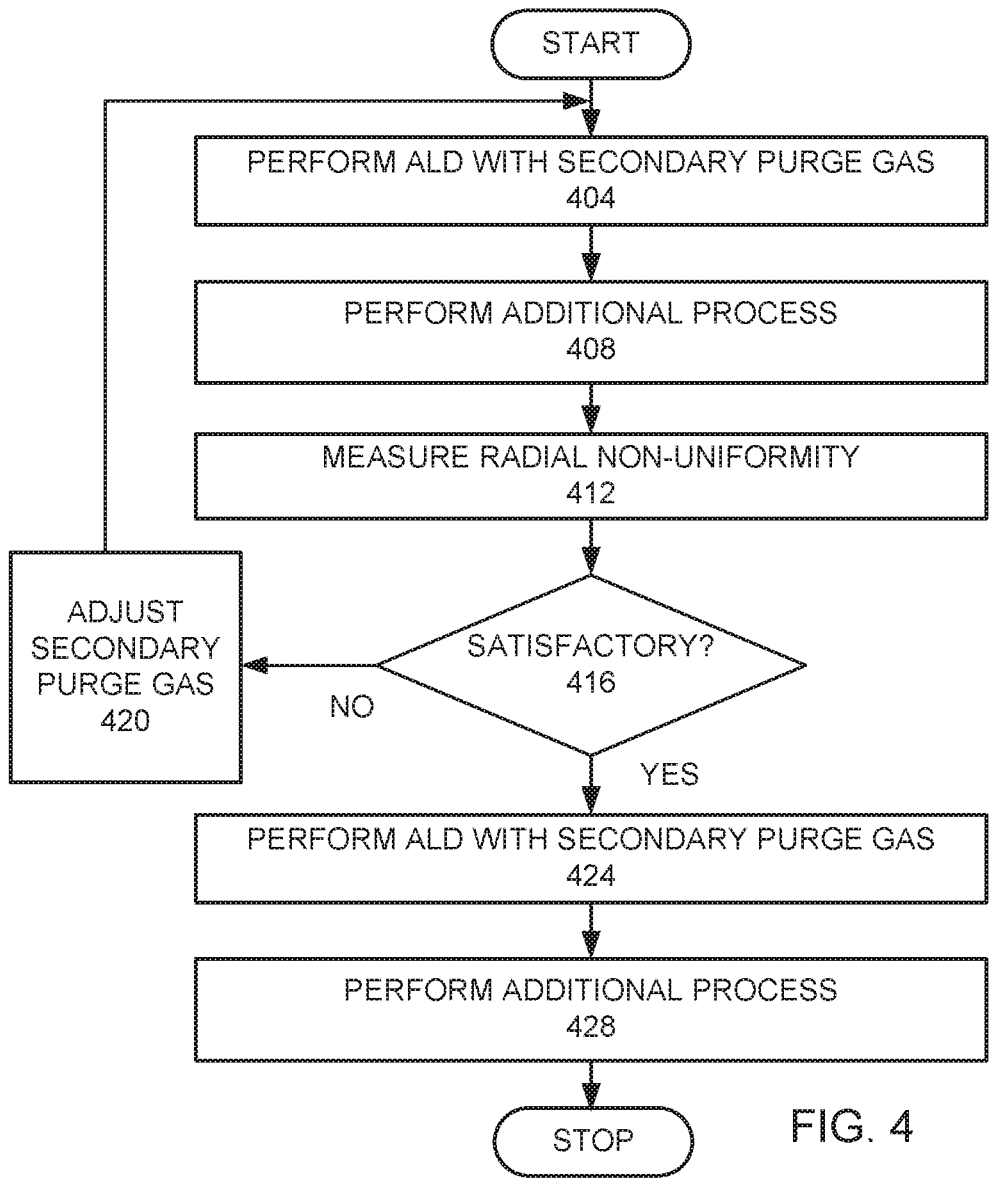
FIG. 4 is a flow chart of another embodiment.

FIG. 4 is a high level flow chart of a method used in another embodiment. A substrate 208 is processed by performing an ALD process using a secondary purge gas (step 404). The flow rate and components of the secondary purge gas tune a radial non-uniformity. An additional process is performed on the substrate 208 (step 408), where the additional process (step 408) causes a radial non-uniformity. The radial non-uniformity of the resulting product on the substrate is measured (step 412). The measured radial non-uniformity is the sum of the radial non-uniformity of the ALD process (step 404) and the radial non-uniformity of the additional process (step 408). If the measured radial non-uniformity is not satisfactory, the secondary purge gas recipe is adjusted (step 420). This would entail adjusting the flow rate of the secondary purge gas and/or the components of the secondary purge gas. Steps 404 to 420 are repeated until the measured radial non-uniformity is satisfactory (step 416). A satisfactory recipe for the secondary purge gas has been identified. Subsequent substrates are processed using the identified satisfactory recipe for the secondary purge gas (step 424). The additional process is performed on each substrate (step 428).

The atomic layer deposition process (steps 404 and 424) may use the same atomic layer deposition process described in the previous embodiment (step 108). The recipe for the secondary purge gas causes the atomic layer deposition process (steps 404 and 424) to have a radial non-uniformity that is complementary to the radial non-uniformity of the additional process (step 408, 428).

In some embodiments, the additional process (step 428) may be performed before the ALD with the secondary purge gas (step 424). The secondary purge gases used in the described above may be used in various embodiments. An example of an additional process may be a carbon trim process. Other examples of additional processes may be other processes used during double or multiple patterning. During double or multiple patterning, feature size is reduced by factors of the power of 2. The number of defects caused by non-uniformity increases as feature size is reduced. Providing methods of increasing uniformity during double or multiple patterning processes reduces defects. Various embodiments use the secondary purge gas as an additional parameter to provide a tuned non-uniformity, which is complementary to other processes used for double or multiple patterning.

In other embodiments, the secondary purge gas may be used with a chemical vapor deposition (CVD) process or plasma-enhanced chemical vapor deposition (PECVD) process. In such embodiments, the flow of the secondary purge gas may be varied while performing a CVD or PECVD process. In other embodiments, the flow of the secondary purge gas is tuned to cause the CVD or PECVD process to either have a dome shape or bowl shape non-uniformity.

Figure 5:
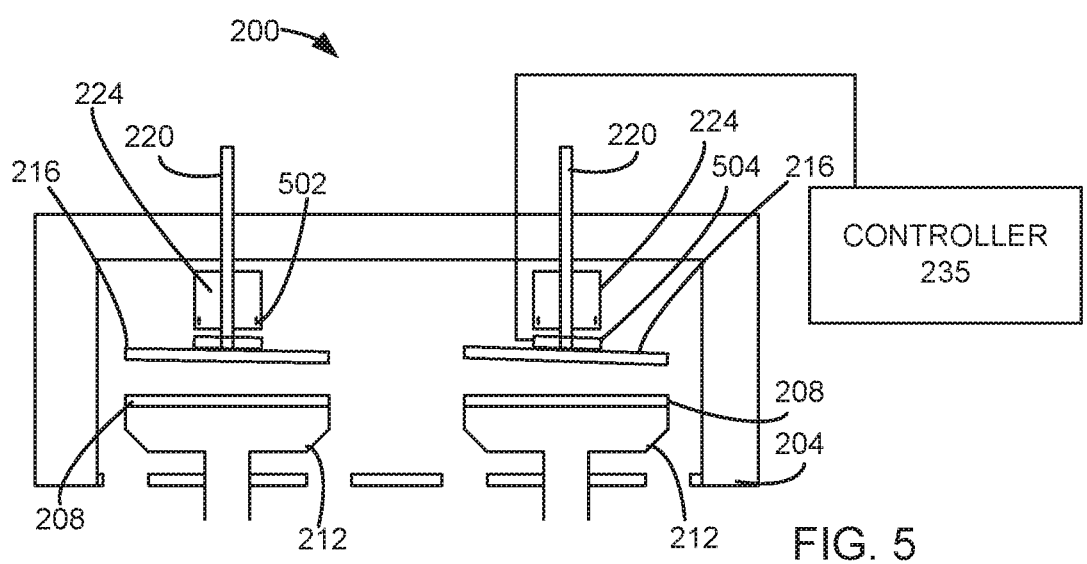
FIG. 5 is a cut away schematic view of another embodiment.

FIG. 5 is a cut away side view of a processing chamber 200, used in another embodiment. The processing chamber 200 has a chamber wall 204. Within the chamber wall 204 are located four processing stations. Each processing station comprises a pedestal 212 for supporting a substrate 208, a showerhead 216 for providing gas to the substrate 208 below the showerhead 216, and a manifold 220 connecting the showerhead 216 to a gas source. A secondary purge gas outlet 224 is in fluid connection with a secondary purge gas source. In this embodiment, the secondary purge gas outlet 224 is in the shape of a cylindrical collar surrounding the manifold 220. The cylindrical collar 224 has apertures 502 to allow the secondary purge gas to flow outwardly in a radial direction over the top of the showerhead 216. Showerhead actuators 504 are mechanically connected to the showerhead 216. A controller 235 is controllably connected to the showerhead actuators 504.

The showerhead actuators 504 are able to adjust the tilt of the showerheads 216. The controller 235 allows for adjustment of the showerheads 216 during or between processing. Tilting the showerheads 216 may be used to create azimuthal non-uniformity in the flow of the secondary purge gas. The tilting of the showerheads 216 also changes the gap spacing between the showerheads 216 and the pedestals 212, which changes the power delivery between the showerheads 216 and the pedestals 212. Such a change in spacing is azimuthally non-uniform.

Subsequent processes may be azimuthally non-uniform. The tilting of the showerheads 216 during a deposition process is designed to create an azimuthal non-uniformity that is complementary to an azimuthal non-uniformity caused by subsequent processes. The azimuthal non-uniformities are considered complementary, if the resulting product after both processes are performed is more azimuthally uniform than a product that is formed by the complementary non-uniform process alone.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for processing a substrate, wherein the substrate is located below a showerhead in a processing chamber, comprising:
   depositing a deposition layer on the substrate below the showerhead in the processing chamber, wherein at least one deposition gas is provided through the showerhead;
   flowing a secondary purge gas during the depositing the deposition layer from a location outside of the showerhead in the processing chamber forming a flow curtain around an outer edge of the showerhead, wherein the secondary purge gas comprises at least one component gas;

changing a partial pressure of the at least one component gas over time during the depositing the deposition layer, wherein the depositing the deposition layer has a non-uniformity, wherein the changing the partial pressure changes the non-uniformity over time during the depositing the deposition layer; and providing a non-uniform etch back process below the showerhead in the processing chamber, wherein the non-uniform etch back process is complementary to the non-uniformity of the depositing the deposition layer, wherein the deposition layer after the non-uniform etch back process is more uniform than the deposition layer before the non-uniform etch back process.

2. The method, as recited in claim 1, wherein the changing the partial pressure of the at least one component gas comprises changing a flow rate of the at least one component gas.

3. The method, as recited in claim 1, wherein the at least one component gas comprises at least one of Ar, He, $O_2$, CO, $CO_2$, $O_3$, or $N_2$.

4. The method, as recited in claim 1, wherein the non-uniformity comprises a radial non-uniformity.

5. The method, as recited in claim 4, wherein the deposition layer increases along a radial distance from a center.

6. The method, as recited in claim 4, wherein the deposition layer decreases along a radial distance from a center.

7. The method, as recited in claim 1, wherein the depositing the deposition layer comprises providing an atomic layer deposition process.

8. The method, as recited in claim 7, wherein the atomic layer deposition process, comprises:
flowing a precursor gas;
flowing an oxidation gas; and
providing a RF power to transform the oxidation gas into a plasma.

9. The method, as recited in claim 1, further comprising processing the substrate with an additional process, wherein the processing the substrate with the additional process has a non-uniformity, wherein the non-uniformity of the processing the substrate with the additional process is complementary to the non-uniformity of the depositing the deposition layer.

10. The method, as recited in claim 1, wherein the processing chamber comprises at least two showerheads for simultaneously processing at least two substrates, wherein the flowing the secondary purge gas flows a secondary purge gas for each of the at least two showerheads, so that each of the at least two showerheads has a curtain of the secondary purge gas around an outer edge of each of the at least two showerheads.

11. The method, as recited in claim 1, wherein the deposition layer after the non-uniform etch back process is more uniform than the deposition layer after the non-uniform etch back process would be if the partial pressure of the at least one component gas over was not changed over time during the depositing the deposition layer.

12. A method for processing a substrate, wherein the substrate is located below a showerhead in a processing chamber, comprising:
depositing a deposition layer on the substrate located below the showerhead in the processing chamber, using a deposition process, wherein the deposition process flows at least one deposition gas through the showerhead;

flowing a secondary purge gas during the deposition process from a location outside of the showerhead in the processing chamber forming a flow curtain around an outer edge of the showerhead, wherein the secondary purge gas is tuned to cause the deposition process to either have a dome shape or bowl shape non-uniformity; and providing a complementary etch back non-uniform process that is complementary to the deposition process on the substrate located below the showerhead in the processing chamber, wherein the deposition layer after the non-uniform etch back process is more uniform than the deposition layer before the non-uniform etch back process.

13. The method, as recited in claim 12, wherein the secondary purge gas comprises at least one of Ar, He, $O_2$, CO, $CO_2$, $O_3$, or $N_2$.

14. The method, as recited in claim 12, wherein the non-uniformity is a radial non-uniformity.

15. The method, as recited in claim 14, wherein the deposition layer increases along a radial distance from a center.

16. The method, as recited in claim 14, wherein the deposition layer decreases along a radial distance from a center.

17. The method, as recited in claim 12, wherein the deposition process is an atomic layer deposition process.

18. The method, as recited in claim 12, wherein the non-uniform etch back process is part of a double or multiple patterning process.

19. The method, as recited in claim 18, wherein the changing of the partial pressure of the at least one component gas over time during the depositing the deposition layer is tuned to provide a non-uniformity, which is complementary to the double or multiple patterning process.

20. The method, as recited in claim 12, wherein the deposition layer after the non-uniform etch back process is more uniform than the deposition layer after the non-uniform etch back process would be if the secondary purge gas was not tuned to cause the deposition process to either have a dome shape or bowl shape non-uniformity during the depositing the deposition layer.

* * * * *